(12) United States Patent
Nishikawa et al.

(10) Patent No.: US 6,281,575 B1
(45) Date of Patent: Aug. 28, 2001

(54) MULTI-CHIP MODULE

(75) Inventors: Toru Nishikawa; Masahide Harada, both of Yokohama; Kaoru Katayama, Hadano; Takeshi Miitsu, Hadano; Takayuki Uda, Hadano; Takahiro Daikoku, Ushiku, all of (JP)

(73) Assignee: Hitachi, LTD, Tokyo (JP)

( * ) Notice: Subject to any disclaimer, the term of this patent is extended or adjusted under 35 U.S.C. 154(b) by 0 days.

(21) Appl. No.: 09/348,260

(22) Filed: Jul. 7, 1999

(30) Foreign Application Priority Data

Jul. 8, 1998 (JP) .................................. P10-192654

(51) Int. Cl.$^7$ .............................. H01L 23/10; H01L 23/34

(52) U.S. Cl. .................... 257/707; 257/706; 257/704; 257/712; 257/713; 257/717; 257/720; 257/723; 361/704; 361/705; 361/716; 361/715

(58) Field of Search .................... 257/707, 717, 257/712, 713, 719, 720, 723, 706, 704; 361/704, 705, 716, 715

(56) References Cited

U.S. PATENT DOCUMENTS 4,034,468 * 7/1977 Koopman .............................. 29/628
5,325,265 6/1994 Turlik et al. .

FOREIGN PATENT DOCUMENTS 54-78982 6/1979 (JP) .
60-253248 12/1985 (JP) .
5-160306 6/1993 (JP) .

* cited by examiner

Primary Examiner—Minh Loan Tran
Assistant Examiner—Luan Thai
(74) Attorney, Agent, or Firm—Antonelli, Terry, Stout & Kraus, LLP

(57) ABSTRACT

A multi-chip module is provided with a structure for disposing of a large amount of surplus solder at soldered portions. In this multi-chip module, a cooling member (structure) is soldered directly at the back side of heat generating member such as a semiconductor integrated circuit element. In order to dispose of the surplus solder, the present invention has a first metallized part formed at a cooling member which is larger than a second metallized part formed at the back side of semiconductor integrated circuit element which is solder with the first metallized part.

9 Claims, 7 Drawing Sheets

Shifting in the x direction

Temperature distribution of semiconductor integrated circuit elements st B-B'

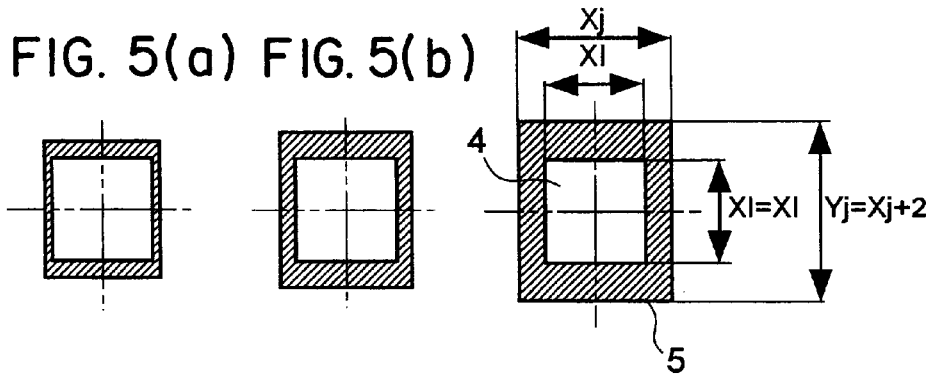
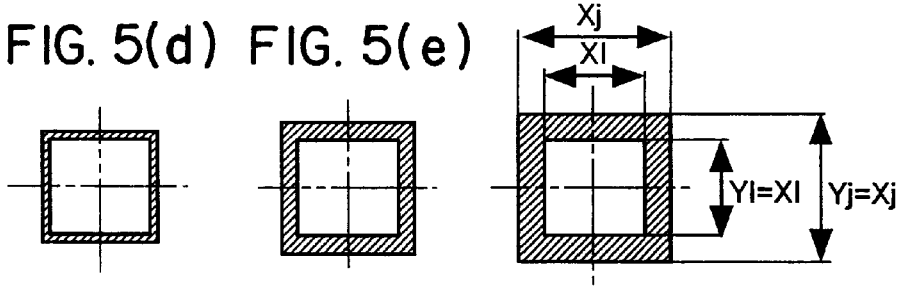
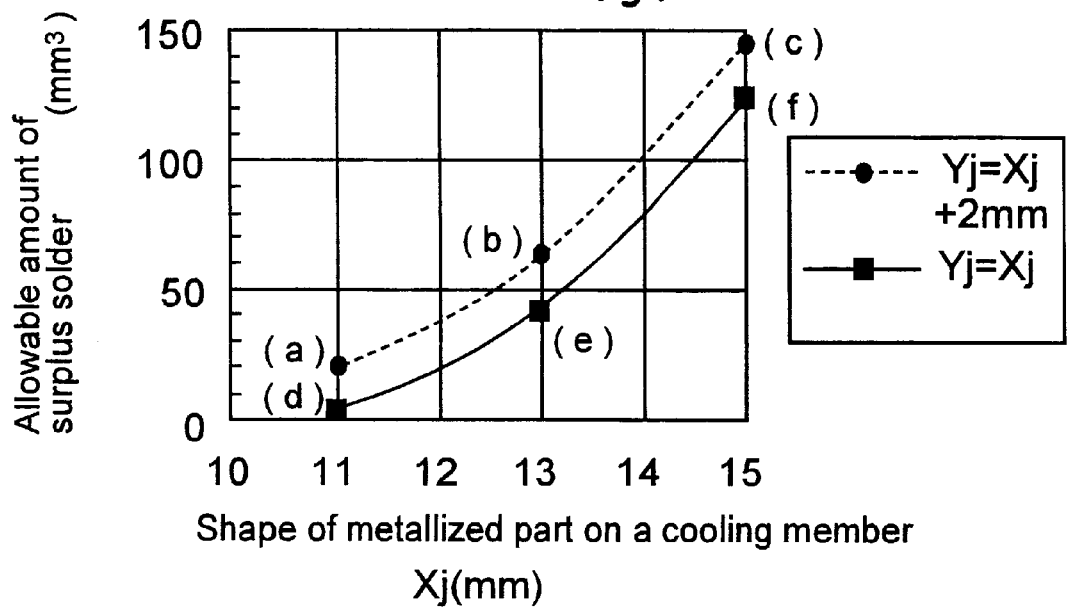

Shifting in the y direction

Shifting in the x direction

Shifting distance in the △ X distance direction (mm)

MULTI-CHIP MODULE

BACKGROUND OF THE INVENTION

The present invention relates to a multi-chip module having a plurality of semiconductor integrated circuit elements (e.g. IC chips) and a cooling member soldered on the semiconductor integrated circuit elements.

As operation frequencies of semiconductor integrated circuit elements speed up, the heat generated from such semiconductor integrated circuit elements increases corresponding to a greater extent. The heat from such semiconductor integrated circuit elements can be reduced with air-cooling methods, air-blast cooling methods, and water-cooling methods. One of these cooling systems is selected appropriately to the heat value of the semiconductor integrated circuit elements. However, even water-cooling systems, which are the best in cooling performance, require higher efficiency of heat transmission between the back side of each of the semiconductor integrated circuit elements and the water-cooling member.

Higher efficiency heat transfer methods, such as the comb-teeth method, the heat transfer grease or the adhesive heat transfer method, and the solder-fixing method, are now under investigation. Among these heat transfer methods, the solder-fixing method with a higher heat transfer rate, which uses a low fusion point metal, is the highest cooling efficiency method. Such solder-fixing methods are disclosed in, for example, U.S. Pat. No. 5,325,265, Unexamined Published Japanese Patent Application Nos. Sho 60-253248, Sho 54-78982, Hei 6-77361, Hei 6-21278, and Hei 5-160306.

However, semiconductor integrated circuit elements, a substrate on which those semiconductor integrated circuit elements are mounted, and a cooling member have warping, uneven thickness, and roughness. Consequently, a solder-fixing method used with a multi-chip module causes a variability of solder thickness among solder portions which are soldered between the semiconductor integrated circuit elements and the cooling member.

In order to eliminate this variability, the following two methods have been considered: (1) to provide a proper amount of solder according to the necessary thickness at every soldered portion; and (2) to provide a fixed amount of solder and to dispose of surplus solder at every soldered portion.

In case of the method (1), an additional process is required to measure the thickness of solder at each soldered portion. Consequently, this method makes processing more complicated.

In case of the method (2), this method doesn't need to measure the thickness of the solder Technologies for disposing of surplus solder are disclosed in the Unexamined Published Japanese Patent Applications Nos. Sho 54-78982, Hei 6-21278, and Hei 5-160306. Especially, these documents disclose technology for simplifying the process of disposing of surplus solder. According to these technologies, a hole is formed corresponding to each of heat generating parts for disposing of surplus solder. The cooling member is soldered fixedly at the back side of heat generating parts such as semiconductor integrated circuit elements. In this case, solder is injected into the hole for filling and connecting the portions between the heat generating part and the cooling member with solder. Besides, if the surplus solder occurs, the surplus solder is disposed of by this hole for eliminating the variability of solder thickness at each soldered portion.

The above conventional technologies can dispose of surplus solder generated by a variability of solder thickness at soldered portions. But these technologies have the following problems.

In these technologies, the surplus solder is filled into a hole at each soldered portion. The amounts of filled surplus solder are each of the soldering portions are different from each other. Consequently, the positions of the solder surfaces in those holes are different from each other. As shown in the Unexamined Published Japanese Patent Nos. Sho 54-78982 and Hei 5-160306, those conventional technologies are still effective just as in the case of dealing with a low heat generation, such as using an air-cooling method.

But in case of dealing with a high test generation such as using a water-cooling method, some arrangements for the effective heat transfer from different heights of the solder surface in the holes are required. For example, in the Unexamined Published Japanese Patent Application No. Hei 6-21278, a low viscosity heat transfer material is disposed between a heat transfer plate which includes holes for filling and disposing solder and a cooling structure in which cooling water flows so as to make them in contact with each other for transferring the heat effectively, e.g., a heat transfer plate.

BRIEF SUMMARY OF THE INVENTION

Now that semiconductor integrated circuit elements generate high heat more and more, it is strongly required that those semiconductor integrated circuit elements are structured so as to cool down more effectively. Especially, a structure that a cooling member is soldered directly at the back side of each of those semiconductor integrated circuit elements is required. In such a case, however, it is difficult for the conventional technologies to manufacture structure with holes to eliminate the variability of solder thickness.

Under such the circumstances, it is an object of the present invention to provide a structure for eliminating much more surplus solder at soldered portions. In this structure, a cooling member is soldered directly at the back side of a heat generating member such as a semiconductor integrated circuit element.

It is another object of the present invention to provide a structure for providing uniform temperature distribution caused by the uneven heat generation from the semiconductor integrated circuit elements.

In order to achieve the above objects, the present invention has a structure that a metallized part A formed at a cooling member is larger than a metallized part B formed at the back side of semiconductor integrated circuit element which us soldered with the first metallized part.

The size of metallized part A is different from the size of metallized part B. Consequently, this structure has an area where the metallized part does not overlap the metallized part A. As the surplus solder occurs at the soldered portion between the metallized part A and the metallized part B, the surplus solder is pushed out to the area and some amount of the surplus solder is disposed out of the area. Besides, the amount of the surplus solder can be controlled by the area size.

In addition, the present invention has a structure that a center of metallized part A formed at a cooling member is shifted from a center of metallized part B formed at the back side of a semiconductor integrated circuit element which is soldered with the metallized part A.

By shifting the center of metallized part A or metallized part B, it is possible to increase the area size where the metallized part B does not overlap the metallized part A. Consequently according to this increase, it is also possible to increase the amount of the allowable surplus solder efficiently at each soldered portion.

And, furthermore, the present invention has a structure that the center of metallized part A is shifted from the center of metallized part B so that the solder width might become wider at the high heat generating area of the semiconductor integrated circuit element than at the low heat generating area. Consequently, it is possible to make the temperature distribution of the semiconductor integrated circuit element uniform by expanding the solder width at the high heat generation area side of the semiconductor integrated circuit element. As a result, the temperature distribution caused by uneven heat generation from the semiconductor integrated circuit elements can be made uniform.

The above structure is suitable for use in multi-chip modules and computers.

BRIEF DESCRIPTION OF THE DRAWINGS

FIGS. 5(a) to 5(g) show characteristics indicating the relationship between a cross sectional view and a metallized part size of each cooling structure in the present invention.

DESCRIPTION OF THE PREFERRED EMBODIMENT

The present invention will be described with reference to the accompanying drawings in which preferred embodiments of the invention are shown.

Figure 1:
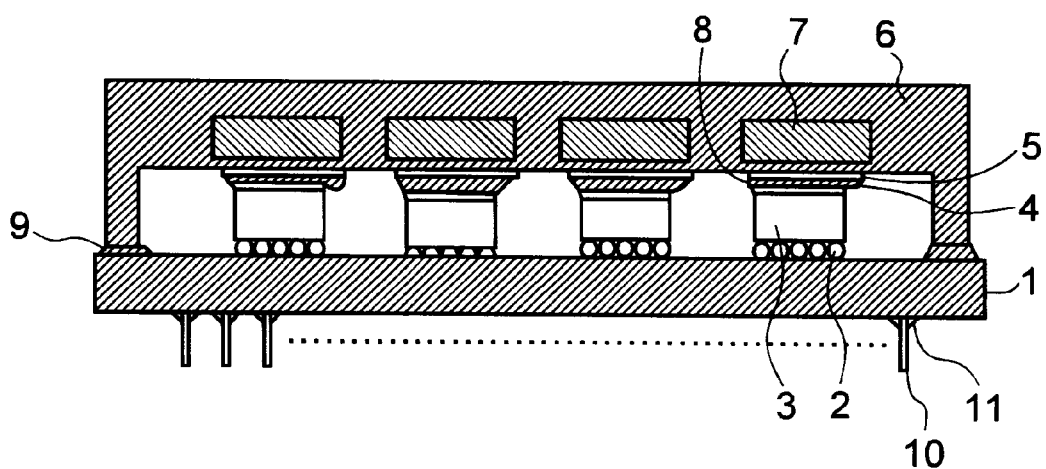
FIG. 1 is a cross sectional view of a multi-chip module, showing an example of use of the present invention.

FIG. 1 shows a cross sectional view of a multi-chip module indicating an example of the present invention. In FIG. 1, semiconductor integrated circuit elements 3 are connected electrically to a multi-layer interconnection substrate 1 via solder balls 2. A metallized part 4 is formed at the back side of each of the semiconductor integrated circuit elements 3 where no electrical connection is provided. The metallized part 4 is connected to a metallized part 5 formed on a cooling structure 6 by fixing solder 8. The cooling structure 6 is connected to the multi-layer interconnection substrate 1 by sealing solder 9 so as to seal the multi-layer interconnection substrate 1 mounting the semiconductor integrated circuit elements 3 thereon. The heat generated from the semiconductor integrated circuit elements 3 is mainly passed through the fixing solder 8 and the cooling structure 6 so as to be transferred to a refrigerant 7 and cooled down very efficiently.

Each metallized part 5 formed on the cooling structure prevents the fixing solder 8 from flowing into unnecessary areas and holds the fixing solder 8 at the back side of each of the semiconductor integrated circuit elements to be cooled down. In addition, each metallized part 5 prevents the fixing solder 8 from coming in contact with the solder balls 2 provided between the multi-layer interconnection substrate 1 and the semiconductor integrated circuit elements 3 so as to work as an electrical connection part, thereby preventing short-circuiting between the fixing solder 8 and the solder balls 2.

The fixing solder 8 is varied in thickness due to warping, uneven thickness, roughness, and other factors of the semiconductor integrated circuit elements 3, the multi-layer interconnection substrate 1 on which the semiconductor integrated circuit elements 3 are mounted, and the cooling structure 6. Therefore, if metallized part 4 was the same size as metallized part 5, and a fixed amount of solder, which is the same as the amount of the maximum thickness portion of the fixing solder 8, was supplied to each connecting portion between metallized part 4 and metallized part 5, surplus solder occurs and overflows onto the side surface of semiconductor integrated circuit elements 3 at the thinner portion of the fixing solder 8.

In order to eliminate the difference of the proper (necessary) solder amount among soldered portions which is caused by this variability, the present invention forms metallized part 5 on the cooling structure 6 larger than the metallized part 4 formed at the back side of each of the semiconductor integrated circuit elements 3 and solders between those metallized parts 4 and 5. An accordance with another aspect of the present invention, the centers of those metallized parts are shifted from each other.

This structure for eliminating surplus solder efficiently will be described with reference to FIGS. 2 through 4.

FIG. 2 shows cross sectional views of surplus solder in the case of the present invention. FIG. 3 shows partial cross sectional views of a soldered portion indicating how a surplus solder shape is changed by sizes of a metallized part in the present invention. FIG. 4 shows partial cross sectional views of a soldered portion indicating how a surplus solder shape is changed by shifting distances in the present invention.

Figure 2A:
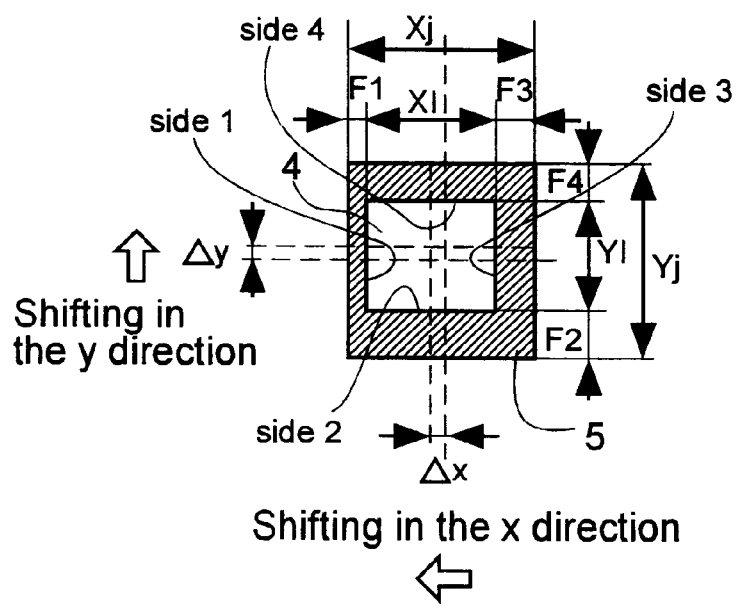
FIGS. 2(a) to 2(c) are cross sectional views of handling surplus solder in the present invention.
Figure 2B:
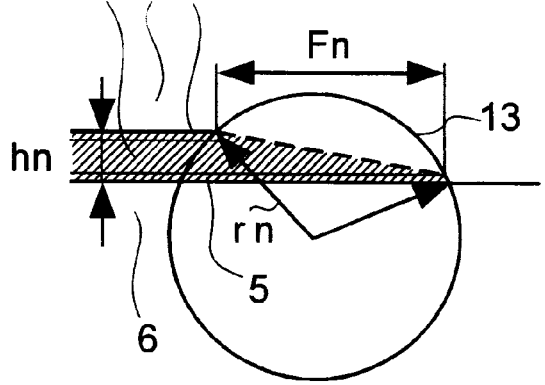
Figure 2C:
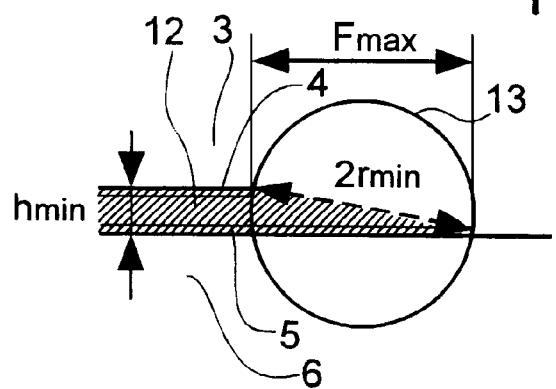

In this case, each metallized part 5 formed on the cooling structure 6 is larger than the metallized part 4 formed at the back side of each of the semiconductor integrated circuit elements 3 and the centers of the metallized parts 4 and 5 are shifted from each other as shown in FIG. 2(a). The cross sectional view of the fixing solder at a side is as shown in FIG. 2(b). The cross sectional view 12 indicates supply of a proper (necessary) amount of solder. On the other hand, as surplus solder occurs at that connecting portion, the shape of surplus solder becomes part of an arc (shape 13) due to the interfacial tension of the solder as shown in FIG. 2(b). The solder then changes its shape uniformly by keeping balance between the rising of the internal pressure and the interfacial tension at each soldered portion. The curvature radius of the surplus solder is reduced according to the increase of the surplus solder amount. When the shape 13 of the surplus solder becomes a semi-circle as shown in FIG. 2(c), the curvature radius of the surplus solder is minimized. If the surplus solder exceeds the amount corresponding to the semi-circle, the shape of the surplus solder cannot be changed uniformly any more and it begins to gather locally. Consequently, the shape of the surplus solder cannot be controlled any more. Consequently, when the curvature radius is minimized, the amount of surplus solder is assumed as a maximum of the allowable amount of surplus solder.

As described above, it is possible to dispose of the surplus solder efficiently at each soldered portion by making the shape 13 of the surplus solder.

Figure 3A:
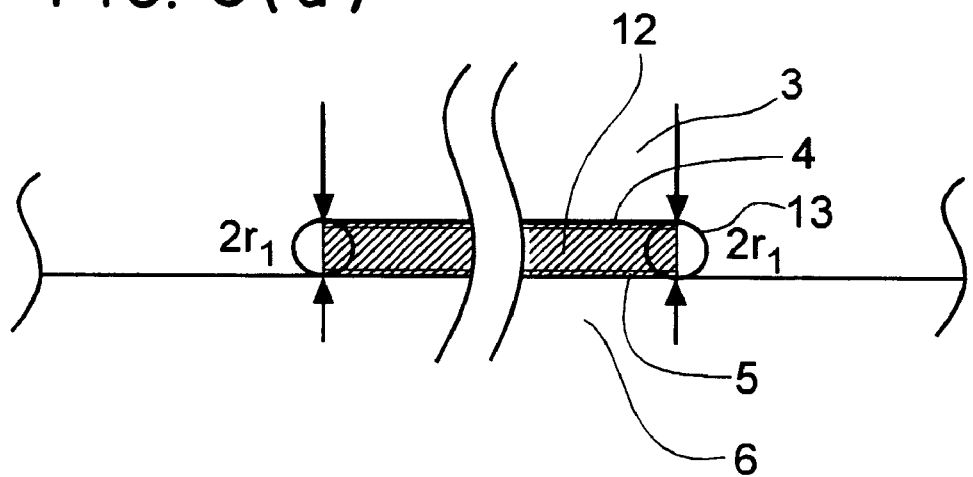
FIGS. 3(a) and 3(c) are partial cross sectional views of a solder portion indicating how a surplus solder shape is changed by sizes of a metallized part in the present invention.
Figure 3B:
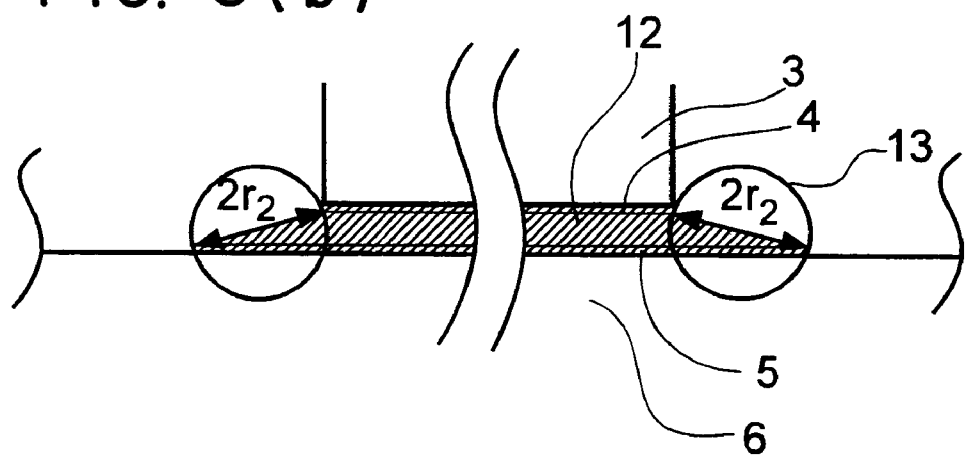
Figure 3C:
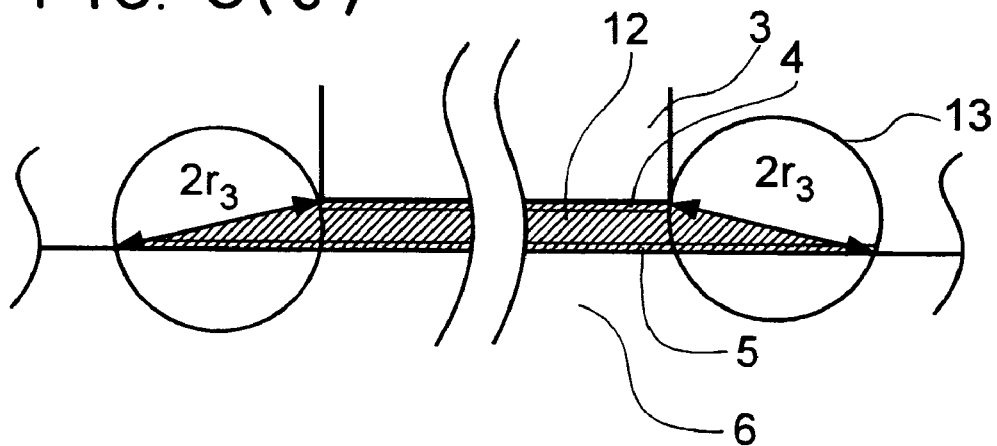

If the center of those metallized parts 4 and 5 are shifted from each other and soldered, the width of surplus solder is varied among four sides of the metallized parts 4 or 5. In this case, when the cross sectional view of the surplus solder becomes a semi-circle at the side where the surplus solder's width is the longest one, the amount of surplus solder is assumed as a maximum of the allowable amount of surplus solder. Such as allowable amount of surplus solder (i.e., the amount of surplus solder to be eliminated) can be increased by increasing the curvature radius when the cross sectional view of surplus solder becomes a semi-circle. For example such as shown in FIGS. 3(a) to (c), as the metallized part 5 is made larger, it is possible to increase the curvature radius to r1, r2, and r3 sequentially when the cross sectional view of surplus solder becomes a semi-circle so that the amount of allowable surplus solder can thus be increased.

Figure 4A:
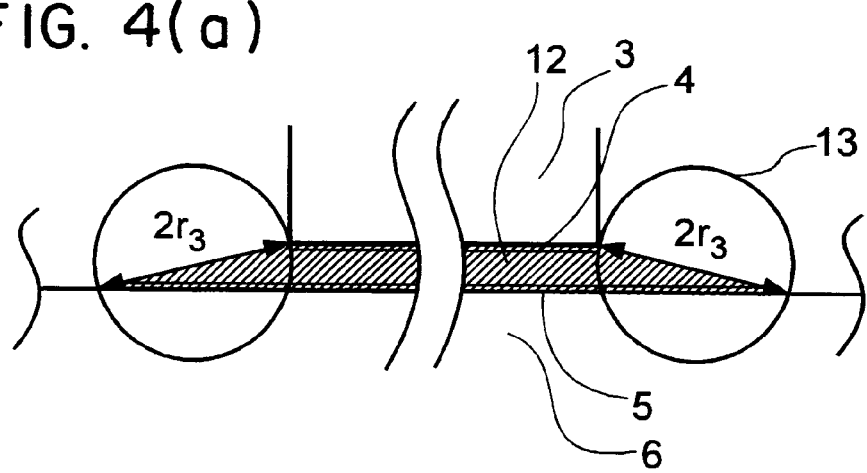
FIGS. 4(a) to 4(c) are partial cross sectional views of a solder portion indicating how a surplus solder shape is changed by shifting distances in the present invention.
Figure 4B:
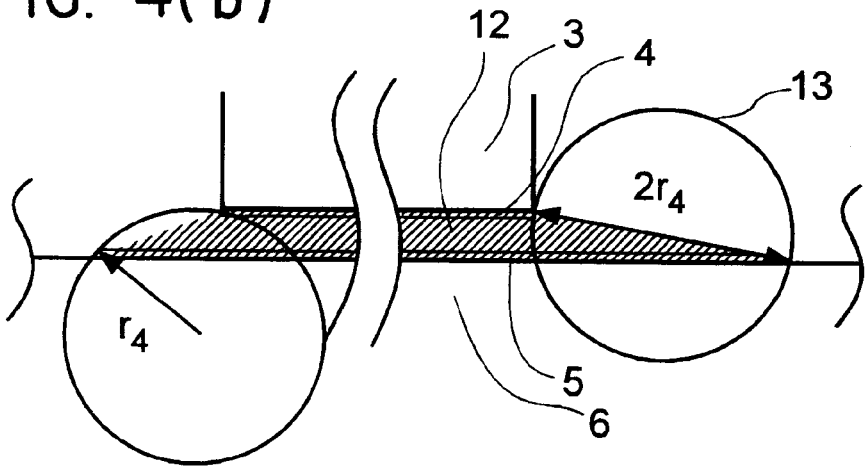
Figure 4C:
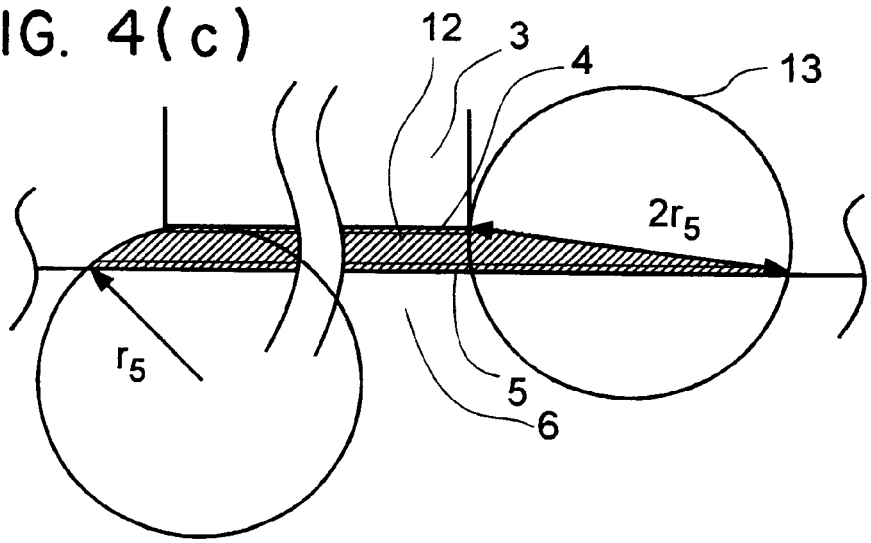

In addition, even in the case of a combination of same sized metallized parts, the amount of allowable surplus solder can be increased by increasing the shifting distance between the metallized part 4 at the back side of each of the semiconductor integrated circuit elements 3 and each metallized part 5 on the cooling structure 6 more from (a) to (b), and further to (c) as shown in FIG. 4. In this case, the amount of allowable surplus solder is increased at a side where the solder width is increased due to the shifting distance between the metallized parts 4 and 5. On the other hand, the amount of allowable surplus solder is decreased at a side where the solder width is decreased. Consequently, the shifting distance must be selected properly so as to increase the amount of allowable surplus solder as a whole.

As described above, it is possible to increase the amount of the allowable surplus solder efficiently at each soldered portion by the shifting distance.

Figure 6A:
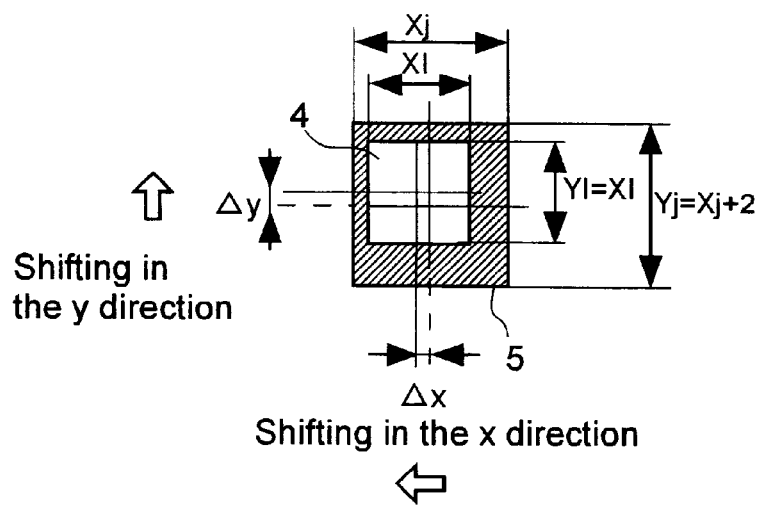
FIG. 6 shows characteristics indicating the relationship between a cross sectional view of a cooling structure and a shifting distance when in soldering, and an amount of allowable surplus solder in the present invention.
Figure 6B:
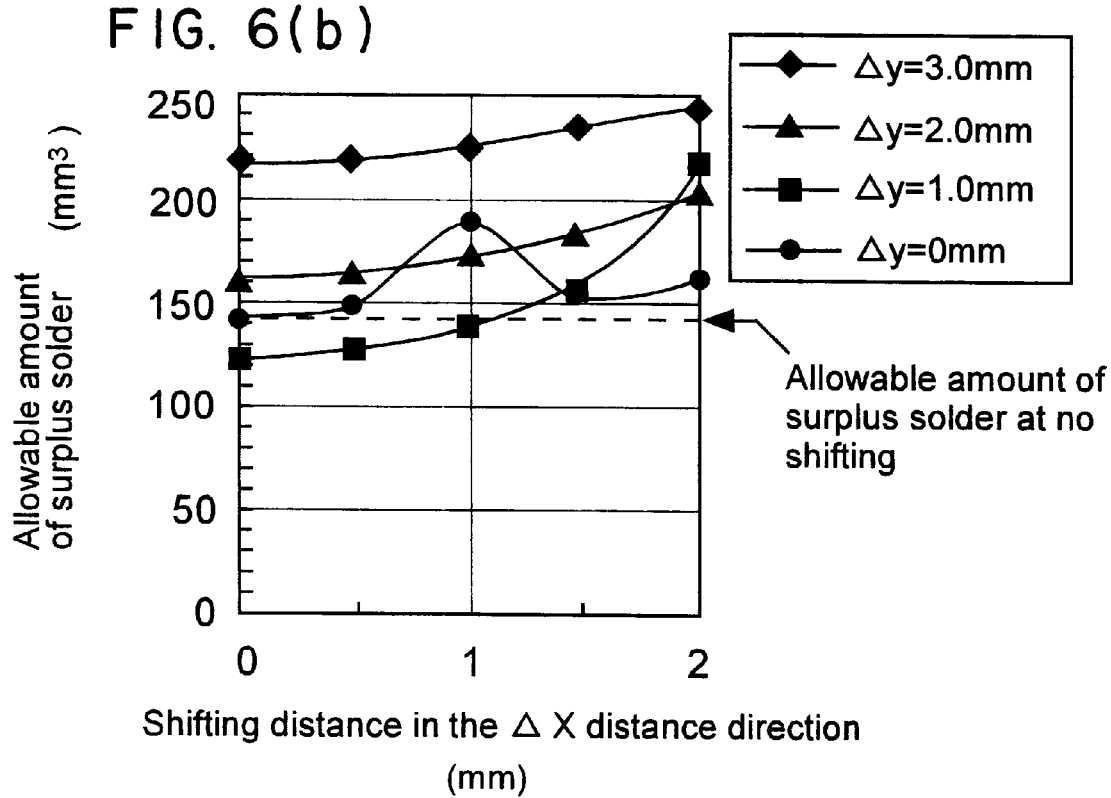

FIG. 5 shows the characteristics indicating the relationship between the size of a metallized part and the amount of allowable surplus solder. FIG. 6 shows the characteristics indicating the relationship between a shifting distance and an amount of allowable surplus solder when the metallized parts are soldered. In other words, FIGS. 5 and 6 show how effective it is to expand the metallized parts 4 and 5 in size and to shift those metallized parts 4 and 5 to be soldered quantitatively for increasing the amount of allowable surplus solder. In these cases, the metallized part 4 on the back side of each of the semiconductor integrated circuit elements 3 is □10 mm.

Figure 7B:
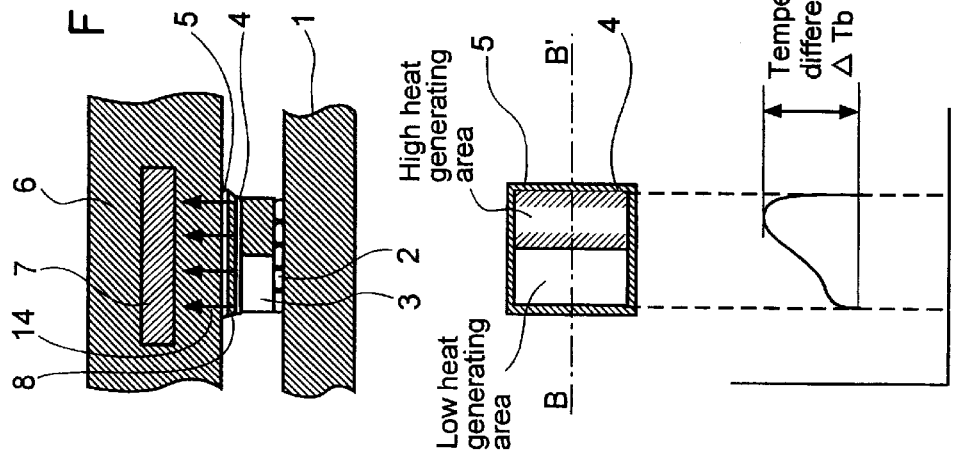
FIGS. 7(a) and (b) show the characteristics indicating a uniform temperature distribution of semiconductor integrated circuit elements in the present invention.
Figure 7A:
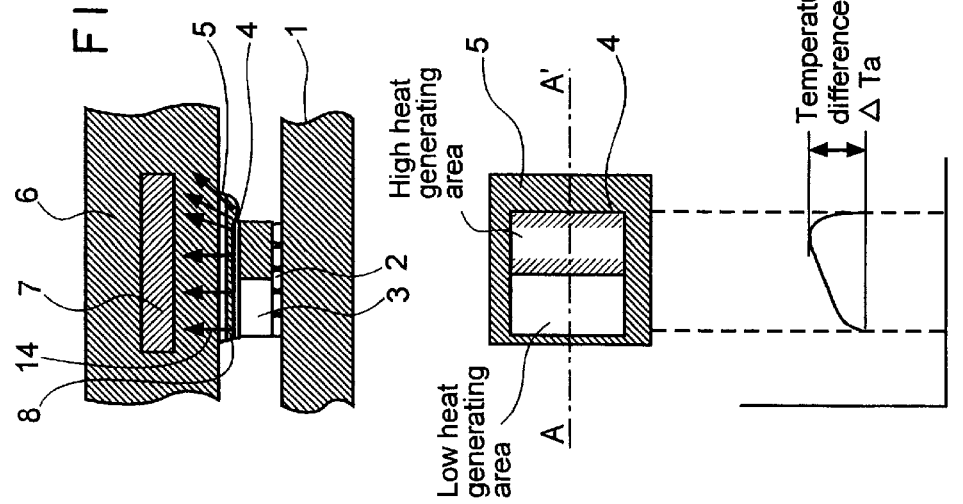

FIG. 7 shows a uniformed temperature distribution of the semiconductor integrated circuit elements. The heat from the semiconductor integrated circuit elements 3 is reduced by the cooling structure 6 via fixing solder 8. Usually, the heat generation from the semiconductor integrated circuit elements 3 is not uniform. As shown in FIG. 7, the semiconductor integrated circuit elements 3 can be divided into a high heat generation area and a low heat generation area. And, as shown in FIG. 7(b), if the metallized parts 4 and 5 both are almost same size, and are soldered so that their centers are aligned, the temperature of the semiconductor integrated circuit elements 3 is distributed in a wide range according to the distribution of heat generation. On the contrary, if the metallized part 5 on the cooling structure 6 is larger than the metallized part 4 and those metallized parts 4 and 5 are shifted from each other at their centers so as to expand the solder width at the high heat generation area side, the temperature at high heat generation area side can be reduced much more. Consequently, the temperature at the high heat generation area side can be reduced so that the temperature distribution in each semiconductor integrated circuit element 3 is uniform.

As described above, it is possible to make the temperature distribution of a semiconductor integrated circuit element uniform by expanding the solder width at the high heat generation area side of the semiconductor integrated circuit element.

According to the present invention, it is possible to increase the amount of surplus solder to be disposed of at each soldered portion. Consequently, it is unnecessary to limit a supply of solder accurately according to a thickness of solder when soldering, thereby simplifying the process.

Furthermore, since the solder width is expanded more at the high heat generation side than at the low heat generation side of the semiconductor integrated circuit elements, the cooling efficiency can be improved, so that the temperature distribution in the semiconductor integrated circuit elements can be made uniform.

What is claimed is:

1. A multi-chip module comprising:

a substrate;

a plurality of semiconductor integrated circuit elements disposed on the substrate, each of said semiconductor integrated circuit elements having a first metallized portion;

a cooling portion having a second metallized portion being larger than the first metallized portion, said second metallized portion disposed corresponding to the first metallized portion; and a connecting portion disposed between the first metallized portion and the second metallized portion, said connecting portion connecting the first metallized portion and the second metallized portion;

wherein the center of said first metallized portion and the center of said second metallized portion are shifted from each other;

wherein said shifting distance is over ¼ of the difference of the size between said first metallized portion and said second metallized portion.

2. A multi-chip module comprising:

a substrate;

a plurality of integrated circuit elements disposed on the substrate, each of said semiconductor integrated circuit elements having a first metallized portion;

a cooling portion having a second metallized portion; and a connecting portion disposed between the first metallized portion and the second metallized portion, said connecting portion connecting the first metallized portion and the second metallized portion, said connecting portion having a non-overlapping area between the first metallized portion and the second metallized portion;

wherein the center of said first metallized portion and the center of said second metallized portion are shifted from each other;

wherein said shifting distance is over ¼ of the difference of the size between said first metallized portion and said second metallized portion.

3. A multi-chip module comprising:
a substrate;
a plurality of semiconductor integrated circuit elements disposed on the substrate, each of said semiconductor integrated circuit elements having a first metallized portion; and
a cooling portion having a second metallized portion, said second metallized portion being larger than the first metallized portion and connected to the first metallized portion with solder;
wherein the center of said first metallized portion and the center of said second metallized portion are shifted from each other;
said shifting distance is over ¼ of the difference of the size between said first metallized portion and said second metallized portion.

4. The multi-chip module comprising:
a substrate;
a plurality of semiconductor integrated circuit elements disposed on the substrate, each of said semiconductor integrated circuit elements having a first metallized portion;
a cooling portion having a second metallized portion being larger than the first metallized portion, said second metallized portion disposed corresponding to the first metallized portion; and
a connecting portion disposed between the first metallized portion and the second metallized portion, said connecting portion connecting the first metallized portion and the second metallized portion,
wherein each of said semiconductor integrated circuit elements has a high heat generating area and a low heat generating area generating lower heat then the high heat generation, and the center of said first metallized portion and the center of said second metallized portion are shifted from each other so that the soldering width corresponding to said high heat generating area is wider than the soldering width corresponding to said low heat generating area.

5. The multi-chip module comprising:
a substrate;
a plurality of integrated circuit elements disposed on the substrate, each of said semiconductor integrated circuit elements having a first metallized portion;
a cooling portion having a second metallized portion; and
a connecting portion disposed between the first metallized portion and the second metallized portion, said connecting portion connecting the first metallized portion and the second metallized portion, said connecting portion having a non-overlapping area between the first metallized portion and the second metallized portion;
wherein each of said semiconductor integrated circuit elements has a high heat generating area and a low heat generating area generating lower heat then the high heat generation, and the center of said first metallized portion and the center of said second metallized portion are shifted from each other so that the soldering width corresponding to said high heat generating area is wider than the soldering width corresponding to said low heat generating area.

6. The multi-chip module comprising:
a substrate;
a plurality of semiconductor integrated circuit elements disposed on the substrate, each of said semiconductor integrated circuit elements having a first metallized portion; and
a cooling portion having a second metallized portion, said second metallized portion being larger than the first metallized portion and connected to the first metallized portion with solder;
wherein said semiconductor integrated circuit element has a high heat generating area and a low heat generating area generating lower heat then the high heat generation, and the center of said first metallized portion and the center of said second metallized portion are shifted from each other so that the soldering width corresponding to said high heat generating area is wider than the soldering width corresponding to said low heat generating area.

7. The connecting structure comprising:
a substrate;
an integrated circuit element disposed on the substrate, said semiconductor integrated circuit element having a first metallized portion; and
a cooling portion having a second metallized portion, said second metallized portion being larger than the first metallized portion and connected to the first metallized portion with solder;
wherein said semiconductor integrated circuit element has a high heat generating area and a low heat generating area generating lower heat then the high heat generation, and the center of said first metallized portion and the center of said second metallized portion are shifted from each other so that the soldering width corresponding to said high heat generated area is wider than the soldering width corresponding to said low heat generating area.

8. The multi-chip module comprising:
a substrate;
a plurality of semiconductor integrated circuit elements disposed on the substrate, each of said semiconductor integrated circuit elements having a first metallized portion;
a cooling portion having a second metallized portion, the surface area for holding solder of the second metallized portion being larger than the surface area for holding solder of the first metallized portion; and
a connecting portion disposed between the first metallized portion and the second metallized portion, said connecting portion connecting the first metallized portion and the second metallized portion with solder;
wherein each of said semiconductor integrated circuit elements has a high heat generating area and a low heat generating area generating lower heat then the high heat generation area, and the center of said first metallized portion and the center of said second metallized portion are shifted from each other so that the soldering width corresponding to said high heat generating area is wider than the soldering width corresponding to said low heat generating area.

9. The multi-chip module comprising:
a substrate;
a plurality of semiconductor integrated circuit elements disposed on the substrate, each of said semiconductor integrated circuit elements having a first metallized portion;
a cooling portion having a second metallized portion, the longest side of the second metallized portion being longer than a longest side of the first metallized portion; and a connecting portion disposed between the first metallized portion and the second metallized portion, said connecting portion connecting the first metallized portion and the second metallized portion;

wherein each of said semiconductor integrated circuit elements has a high heat generating area and a low heat generating area generating lower heat then the high heat generation, and the center of said first metallized portion and the center of said second metallized portion are shifted from each other so that the soldering width corresponding to said high heat generating area is wider than the soldering width corresponding to said low heat generating area.

* * * * *